United States Patent [19]

McCool et al.

[11] 4,243,935

[45] Jan. 6, 1981

[54] ADAPTIVE DETECTOR

[75] Inventors: John M. McCool, El Cajon; Bernard Widrow, Stanford; Robert H. Hearn; James R. Zeidler, both of San Diego, all of Calif.; Douglas M. Chabries, Provo, Utah; Randall H. Moore, San Diego, Calif.

[73] Assignee: The United States of America as represented by the Secretary of the Navy, Washington, D.C.

[21] Appl. No.: 40,251

[22] Filed: May 18, 1979

[51] Int. Cl.³ .................................. G01R 23/16
[52] U.S. Cl. ........................ 324/77 R; 324/77 H; 324/78 F; 324/77 B
[58] Field of Search ............. 324/77 R, 77 D, 77 E, 324/77 H, 78 F, 95, 140 R, 77 B; 364/485, 726

[56] References Cited

U.S. PATENT DOCUMENTS

| | | | |
|---|---|---|---|
| 3,636,333 | 1/1972 | Klund | 324/77 H |
| 3,702,393 | 11/1972 | Fuss | 324/77 H |
| 3,792,245 | 2/1974 | Hocker | 324/77 H |
| 3,875,500 | 4/1975 | Fletcher 324 | 77 H/ |
| 4,080,661 | 3/1978 | Niwa | 324/77 B |
| 4,093,989 | 6/1978 | Flink | 324/77 B |

*Primary Examiner*—Michael J. Tokar
*Attorney, Agent, or Firm*—Richard S. Sciascia; Ervin F. Johnston; John Stan

[57] ABSTRACT

An adaptive detector comprises an adaptive linear prediction filter (ALPF) and a detection processor.

The adaptive filter comprises an input filter, adapted to receive an input signal x(k) and delay it by a time Δ. An L-point, or L-tap, adaptive filter has an input connected to the output of the input filter, a signal r(k) appearing at the output of the filter. A means for summing has two inputs, one for receiving the signal x(k) and the other for receiving an inverted signal from the adaptive filter, the output of the summer being an error signal ε(k). A feedback amplifier, whose input is connected to the output of the summer, takes a portion 2μ, of the output signal ε(k) and feeds it back to the adaptive filter, thereby modifying the tap weights of the adaptive filter.

The detection processor comprises a circuit, whose input is connected to the output of the adaptive filter, to receive the signal r(k), for performing a K-point discrete Fourier transform (DFT) on the signal r(k). A spectral analyzer, whose input is connected to the output of the DFT circuit, performs a spectral analysis on the output signal.

4 Claims, 6 Drawing Figures

ADAPTIVE DETECTOR.

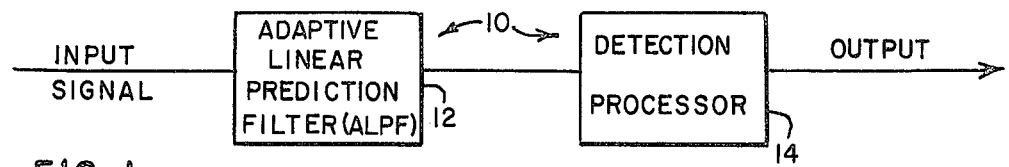
FIG. 1. ADAPTIVE DETECTOR.
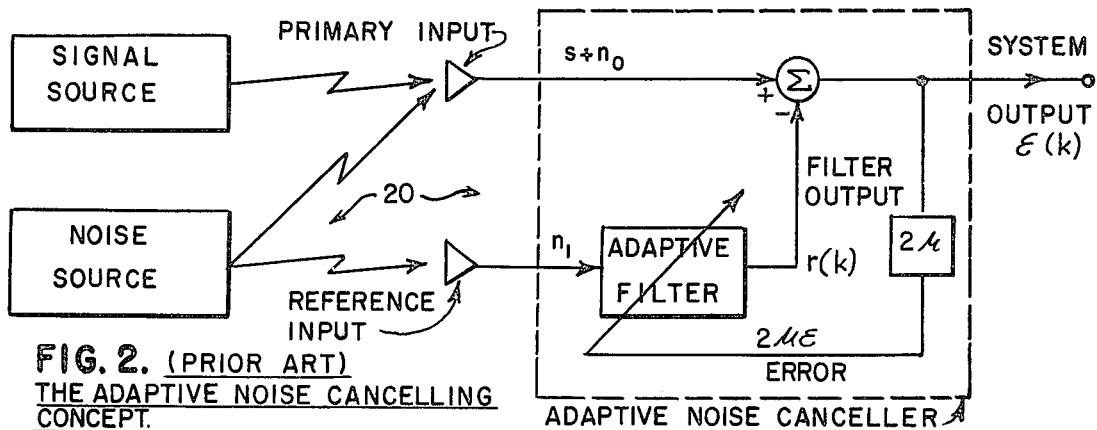
FIG. 2. (PRIOR ART)
THE ADAPTIVE NOISE CANCELLING CONCEPT.
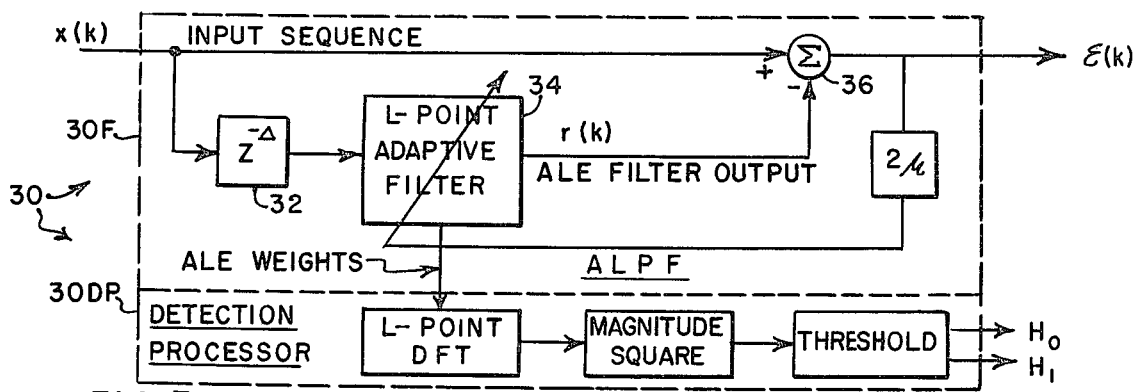
FIG. 3A. (PRIOR ART) ALE WEIGHT TRANSFORM.
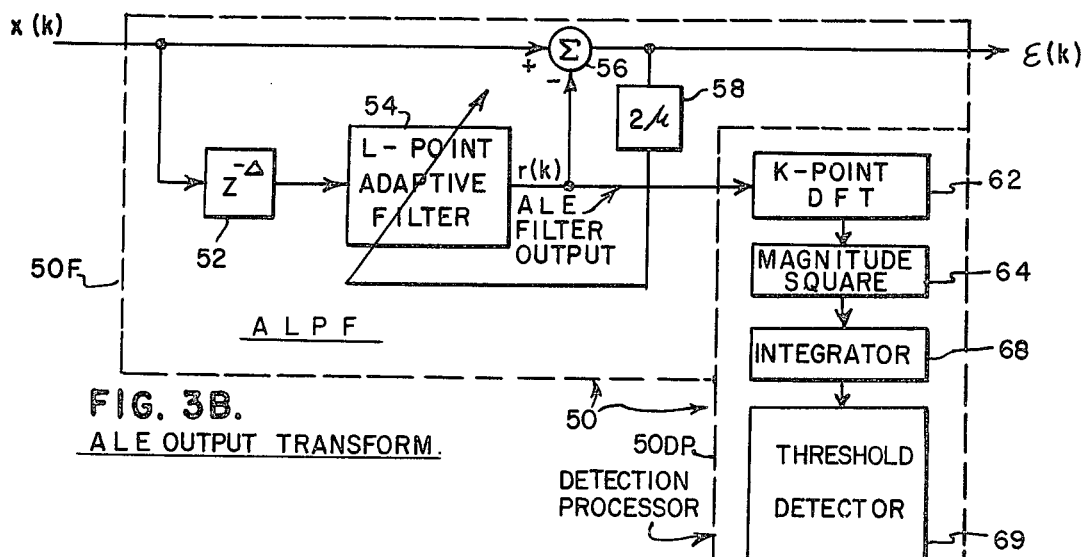
FIG. 3B. ALE OUTPUT TRANSFORM.
FIG. 3. ADAPTIVE DETECTOR IMPLEMENTATIONS.

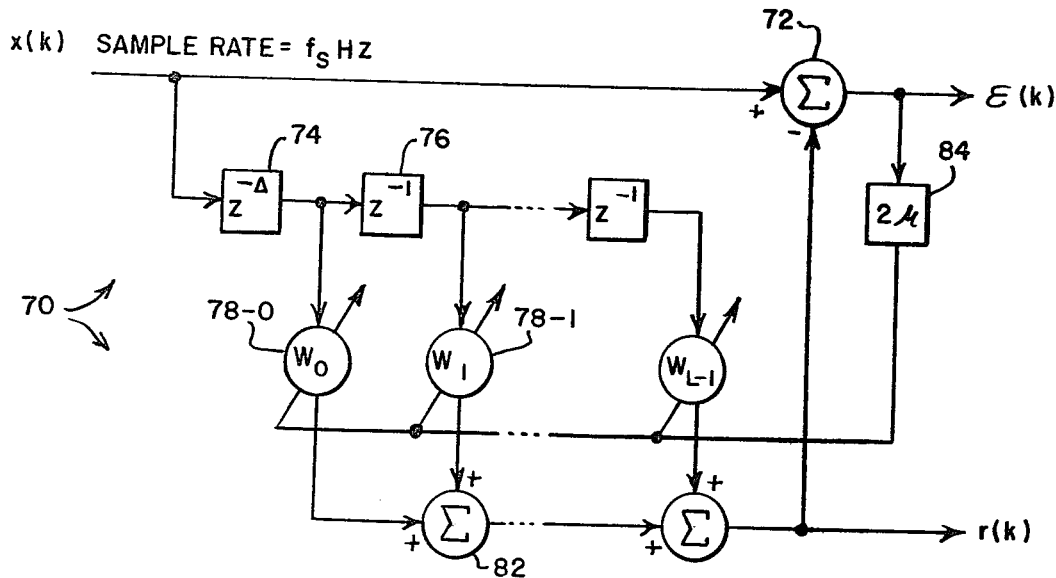
FIG. 4. ADAPTIVE LINE ENHANCER (ALE), THE ALPF OF FIG. 3 SHOWN IN MORE DETAIL.

4,243,935

ADAPTIVE DETECTOR

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

Filters which are used to pass a signal corrupted by noise may be of two types: fixed filters or adaptive filters. For the proper design of fixed filters, the properties of the signal and the noise must be known. However, adaptive filters are able to adjust their weighted taps automatically, the design requiring no prior knowledge of either the signal or noise characteristics.

Filters utilizing noise cancellation, that is, adaptive filters, utilize an auxilliary or reference input derived from one or more sensors located in an environment where the signal is very weak. This reference input is filtered and sent to a different signal circuit where it is subtracted from the primary input which contains both signal and some common noise, thereby cancelling some of the primary noise.

The basic concept of adaptive noise cancelling is illustrated in FIG. 2. A signal s is received by a sensor that also receives a noise $n_0$ which has no correlation with the desired signal s. The combination of the signal s and noise $n_0$ comprise the primary input to the adaptive noise canceller. Another sensor, removed from the first sensor, receives a noise signal $n_1$ which is uncorrelated with the signal but is correlated with the noise signal $n_0$, the second sensor providing the reference input to the canceller. The noise $n_1$, after filtering, produces an output r(k) which is as similar as possible to $n_0$. As is shown in FIG. 2, the filter ouput r is subtracted from the primary input signal, $s+n_0$, in a differencing circuit, to generate the output of the canceller, $\epsilon = s + n_0 - r$.

An adaptive filter, such as the adaptive noise canceller shown in FIG. 2, is different from an ordinary fixed filter in that it automatically adjusts its own impulse response. The adjustment is done through an algorithm, the Widrow-Hoff algorithm in this invention, which is a function of the error signal $\epsilon$, the error signal being dependent on the current output of the filter. If the correct algorithm parameters (i.e., time constant and update rate), are chosen, the noise canceller operates under changing conditions to adjust itself constantly, thereby maintaining minimum power in the error signal.

In noise cancelling system of the type described herein it has been determined that a practical objective is to produce an output signal $z = s + n_0 - v$ that is a best fit to the signal s from the standpoint of least means aquare (LMS) error power. This objective is accomplished by feeding a portion $2\mu e$ of the system output signal r(i) back to the adaptive filter and adjusting the filter tap weights through an LMS adaptive algorithm to minimize total system output power. From this, it may be seen that in an adaptive noise cancelling system, the system output signal, or a portion of it, serves as the error signal for the adaptive process.

The background information in this section has been adapted from the article entitled "Adaptive Noise Cancelling: Principles and Applications," by Widrow, Bernard, et al., which appeared in the Proceedings of the IEEE, Volume 63, No. 12, December 1975.

SUMMARY OF THE INVENTION

An adaptive detector comprises an adaptive linear prediction filter (ALPF) and a detection processor.

The adaptive filter comprises an input filter, adapted to receive an input signal x(k) and delay it by a time Δ. An L-point, or L-tap, adaptive filter has an input connected to the output of the input filter, a signal r(k) appearing at the output of the filter. A means for summing has two inputs, one for receiving the signal x(k) and the other for receiving an inverted signal from the adaptive filter, the output of the summer being an error signal $\epsilon(k)$. A feedback amplifier, whose input is connected to the output of the summer, scales the error signal $\epsilon(k)$ by a multiplicative factor $2\mu$, which is always much less than unity, and feeds it back to the adaptive filter, thereby modifying the tap weights of the adaptive filter.

The detection processor comprises a circuit, whose input is connected to the output of the adaptive filter, to receive the signal r(k), for performing a K-point discrete Fourier transform (DFT) on the signal r(k). A spectral analyzer, whose input is connected to the output of the DFT circuit, performs a spectral analysis on the output signal.

OBJECT OF THE INVENTION

The object of the invention is to utilize adaptive linear prediction prefiltering to suppress the broadband noise level prior to detection processing in order to provide a mechanism for improving system detection performance for narrowband signals of interest.

BRIEF DESCRIPTION OF THE DRAWINGS

FIG. 1 is a block diagram showing the adaptive detector in its simplest form.

FIG. 2 is a block diagram of a prior art adaptive noise canceller.

FIG. 3 comprises a pair of adaptive detector implementations: FIG. 3A showing a prior art adaptive line enhancer (ALE) weight transform; and FIG. 3B showing an implementation using an ALE output transformer.

FIG. 4 is a block diagram of an adaptive line enhancer in more detail than the one shown in FIG. 3.

DESCRIPTION OF THE PREFERRED EMBODIMENTS

FIG. 1 shows the adaptive detector 10 in its simplest form. It comprises an adaptive linear prediction filter (ALPF) 12 and a detection processor 14.

FIG. 2 is an embodiment 20 illustrating an adaptive noise cancelling concept. This concept was described in great detail in the "Background of the Invention."

FIG. 3A a prior art implementation 30 of the ALE weight transformer.

In this invention, an adaptive linear prediction filter (ALPF) is used as a self-tuning filter for the detection of narrowband signals in noise. As is shown in FIG. 3, an L-weight ALP filter, 30F in FIG. 3A or 50F in FIG. 3B is used to estimate the frequencies at which coherent energy is present in the input data sequence x(k). A K-point spectrum analyzer is used to examine either the transfer function of the adaptive filter weights, as is shown in the embodiment 30 shown in FIG. 3A, or to examiner the power spectrum of the adaptive filter output, as illustrated in the embodiment 50 shown in FIG. 3B. In FIGS. 3A and 3B, the spectrum analyzer is called a "detection processor," 30 DP or 50 DP, respectively.

Appropriate selection of the prediction distance $\Delta$ in FIG. 3, on the basis of available a priori information concerning the expected autocorrelation of the noise and signal components allows the ALP filter, 30F in FIG. 3A or 50F in FIG. 3B, to suppress either the correlated or uncorrelated noise components of the input data. This device 70, shown in FIG. 4, has been called a "adaptive line enhancer" (ALE) due to the narrow-band signal enhancement which results from the broad-band noise suppression capability of a linear prediction filter. These properties of the ALE filter was discussed in great detail in the article by Widrow et al referenced in "Background of the Invention."

The embodiments of this invention utilize the implementation of the Widrow-Hoff LMS algorithm to provide a computationally efficient method for updating the ALP filter coefficients, to track temporal variations in the signal and noise statistics. The weights of the ALP filter are updated by this algorithm. A relatively brief explanation of the Widrow-Hoff algorithm is described hereinbelow. A more detailed analysis appears in the Widrow et al article, referenced hereinabove. Another, more complete, explanation is given by Morgan et al., "Real-Time Linear Prediction Using The Least Mean Squares Adaptive Algorithm," *IEEE Trans. on Acoustics, Speech, and Signal Processing*, Vol. ASSP-24, p. 494, 1976.

As illustrated in FIG. 3, the ALE consists of an L-weight linear prediction filter, 30F and 50F, in which the filter coefficients are updated at the input sampling rate. The adaptive filter output $r(k)$ is defined by $$r(k) = \sum_{j=0}^{L-1} w_j(k)x(k-j-\Delta), \quad (1)$$

where $\Delta$, shown in blocks 32 and 52, is the prediction distance of the filters, 34 and 54. The output $r(k)$ is then subtracted from $x(k)$ to form an error sequence $\epsilon(k)$. The error sequence is fed back to adjust the filter weights according to the Widrow-Hoff LMS algorithm, $$w_i(k+1) = w_i(k) + 2\mu\epsilon(k)x(k-i-\Delta), \; i=0,1,\ldots,L-1, \quad (2)$$

where $\mu$ is a constant.

The ALE weight vector $w(k+1)$ at time $k+1$ may be written from Eq. (2) as $$w(k+1) = w(k) + 2\mu x(k)[x(k) - x^T(k)w(k)] \quad (3)$$

where $$x(k) = [x(k-\Delta), x(k-\Delta-1), \ldots, x(k-\Delta-L+1)]^T \quad (3a)$$

and $$w(k) = [w_0(k), w_1(k), \ldots, w_{L-1}(k)]^T. \quad (3b)$$

Taking the expectation of both sides of Eq. (3), there is obtained $$E\{w(k+1)\} = E\{w(k)\} + 2\mu[E\{x(k)x(k)\} - E\{x(k)x^T(k)w(k)\}] \quad (4)$$

Since $E[w(k+1)]$ depends on all the past data $x(k), x(k-1), \ldots$, computation of the convergence of $w(k)$ in the means becomes intractable unless some simplifying assumptions are made. For small $\mu$ and low input signal-to-noise (SNR), there is very little statistical dependence between the $x(k)$ and $w(k)$; i.e., $$E[x^T(k)w(k)] \cong E[(x^T(k)]E[w(k)],$$

and $$E\{x(k)x^T(k)w(k)\} \cong E\{x(k)x^T(k)\}w(k)\} \quad (5)$$

Widrow, in the reference cited hereinabove, has shown that, for uncorrelated data, $E\{w(k)\}$ converges from an arbitrary initial value to $w^*$ as $k \to \infty$, provided $0 < \mu < \lambda_{max}^{-1}$, where $\lambda_{max}$ is the largest eigenvalue of the data autocorrelation matrix and $w^*$ is the optimal Wiener filter weight vector. The term $w^*$ can be obtained from the solution to the discrete Wiener-Hopf matrix equation, $$Rw^* = P, \quad (6)$$

where R is the L × L autocorrelation matrix of the input sequence $x(k)$ and P is the L-element cross-correlation vector with elements $P_j + E\{x(k)x(k+j+\Delta-1)\}$. The convergence of the mean weight vector in the more general cases of correlated data and for nonstationary inputs has been considered for both ideal filters and for cases in which implementation errors are present. It has been shown that the convergence properties of the filters are robust under a wide range of conditions, providing that the inputs to the filter satisfy specified non-degeneracy conditions. Experimental measurements of the mean weight vector of a hardware implementation of the ALE also confirm that $E\{w(k)\} \to w^*$ for increasing k for sinusoidal inputs in uncorrelated noise for many cases of interest.

Since the LMS algorithm only approximates the true LMS error gradient, the weight vector coefficients are obtained from noisy estimates of the optimal Wiener filter solution. This gradient estimation noise, often called "misadjustment noise" is given by $$V_j(k) = w(k) - w_j^*. \quad (7)$$

Widrow et al., in the cited reference, have shown that the variance of $V_j$ may be made arbitrarily small by decreasing the feedback parameter $\mu$. Decreasing $\mu$ also increases the convergence time of the LMS algorithm, however, and a compromise between the response time and the misadjustment noise power must be made in practical applications.

It is generally assumed that the misadjustment noise has a Gaussian distribution. It then follows from Eq. (5) that $$E[V_j(k)] = 0 \quad (8)$$

$$E[V_j(k)V_i(k)] = \mu\epsilon_{min}\delta(i-j),$$

where $\delta(.)$ is the Kronecker delta operator and $\epsilon_{min}$ is the minimum means square error power. Analytical solutions for $w_j^*$ for multiple sinusoids in uncorrelated noise have been derived. When $$x(k) = A \sin(\omega_0 k + \theta) + n(k), \quad (9)$$

where n(k) is a zero-mean white Gaussian noise sequence of variance $v^2$, and $\omega_0$ is known a priori, the sampling frequency can be adjusted so that $$\frac{\omega_0 L}{2\pi} = \text{integer}, \tag{10}$$

where $\omega_0$ is normalized relative to the sampling frequency of $2\pi$ radians. In this case the R-matrix is circulant, and it has been shown that $$w_j^* = \frac{2a^*}{L} \cos[\omega_0(j + \Delta)], \; 0 < j < L - 1, \tag{11}$$

where $$a^* = \frac{(L/2)SNR}{1 + (L/2)SNR} \tag{12}$$

and the input SNR is defined by $$SNR = A^2/2v^2. \tag{13}$$

The amplitude of $w_j^*$ depends nonlinearly on the input SNR, since the transversal filter cannot discriminate between the sinusoid and the broadband noise within the filter passband. It has also been shown by J. Zeidler et al. that (11) also provides an excellent approximation to $w_j^*$ for $(\pi/L) < \omega_0 < \pi[L - 1/(L)]$ for the non-circulant autocorrelation matrices. More details may be obtained from J. Zeidler et al., "Adaptive Enhancement of Multiple Sinusoids in Uncorrelated Noise," *IEEE Trans. on Acoustics, Speech, and Signal Processing*, vol. ASSP-26, p. 240, 1978.

The speed of adaptation of the LMS algorithm is controlled by the dominant eigenvalues of the R-matrix. For the case of a single sinusoid in uncorrelated noise, the optimal weight vector is orthogonal to all eigenvectors of R except the conjugate pair corresponding to frequency $\omega_0$. The eigenvalues associated with these eigenvectors dominate the convergence time and are both approximately given by $$\lambda = v^2 + (A^2 L/4). \tag{14}$$

When the filter is filled with data and all weights are zeroed at k=0, the mean value $\overline{w}_j(k)$ of the jth weight is updated according to the relation $$\overline{w}_j(k) = [1 - (1 - 2\mu\lambda)^k] w_j^*, \; k = 0, 1, \ldots \tag{15}$$

For $2\mu\lambda << 1$ and $k >> 1$, Eq. (15) is approximated by $$\overline{w}_j(k) = [1 - e^{-2\mu k\lambda}] w_j^* \\ = \frac{2a(k)}{L} \cos[\omega_0(j + \Delta)], 0 < j < L - 1, \tag{16}$$

where $$a(k) = [1 - e^{-k/\tau_m}] a^* \tag{17}$$

In Eq. (17), $\tau_m = \frac{1}{2}\mu\lambda$, the mean adaptation time constant.

It has been shown by J. T. Rickard et al. that the power spectral density of the ALE output for an input consisting of a sinusoid in white noise contains three distinct spectral components: a sinusoidal term due to the filtering of the input sinusoid, a white noise term due to the misadjustment noise, and a narrowband noise term due to the white noise passed through the converged Wiener filter. The relative magnitudes of these components were also derived by J. T. Rickard et al., "Second Order Statistics of the Adaptive Line Enhancer, Naval Ocean Systems Center, Technical Report 202, January 1978; to be published in *IEEE Trans. on Acoustics, Speech, and Signal Processing*. It was further shown that $$\xi_{min} = v^2 + (1 - a^*)A^2/2 \approx v^2. \tag{18}$$

Referring back to FIG. 3B, therein is shown one embodiment 50 of the invention. The adaptive detector 50 comprises an adaptive linear predictive filter 50F and a detection processor 50 DP.

The adaptive linear predictive filter 50F comprises an input delay line 52, adapted to receive an input signal x(k) and delay it by a time $\Delta$. An L-point, that is L-tap, adaptive filter 54 has an input connected to the output of the input delay line. At the output of the adaptive filter 54 appears a signal r(k).

A means for summing has two inputs, one for receiving the signal x(k) and the other for receiving an inverted signal from the adaptive filter 54, the output of the summing means being an error signal $\epsilon(k)$.

A feedback amplifier 58, whose input is connected to the output of the summing means 56, takes a portion, $2\mu$, of the output signal $\epsilon(k)$ and feeds it back to the adaptive filter 54, thereby modifying the tap weights.

The adaptive detector 50 further comprises a detection processor 50 DP, which comprises a means 62 which receives the signal r(k) from the adaptive filter 54 and performs a K-point discrete Fourier transform (DFT) on the signal r(k).

At this point, a spectral analyzer, whose input is connected to the output of the K-point transformer 62, performs a spectral analysis on the output signal of the DFT means.

A spectrum analyzer may comprise a means 64, whose input is connected to the output of the DFT means 62 taking the magnitude square for each of the transform values. An integrator 68, whose input is connected to the output of the magnitude squarer 64, integrates the detected signal.

A threshold detector 69, whose input is connected to the output of the integrator 68, determines if a signal is present, $H_1$, or absent $H_0$.

Obviously, many modifications and variations of the present invention are possible in the light of the above teachings, and, it is therefore understood that within the scope of the disclosed inventive concept, the invention may be practiced otherwise than specifically described.

What is claimed is:

1. An adaptive detector comprising:
   an adaptive linear prediction filter (ALPF), which comprises;
   an input delay line, adapted to receive an input signal x(k) and delay it by a time $\Delta$;
   an L-point, that is, L-tap, adaptive filter, having an input connected to the output of the input delay line, at the output of which appears a signal r(k);
   a means for summing, having two inputs, one for receiving the signal x(k) and the other for receiving an inverted signal from the adaptive filter, the output of the summing means being an error signal $\epsilon(k)$;

feedback means, whose input is connected to the output of the summing means, for taking a portion, $2\mu$, of the output signal $\epsilon(k)$ and feeding it back to the adaptive filter, thereby modifying the tap weights:

the adaptive detector further comprising a detection processor which comprises:

means, whose input is connected to the output of the adaptive filter, to receive the signal $r(k)$, for performing a K-point discrete Fourier transform (DFT) on $r(k)$; and means, whose input is connected to the output of the DFT means, for performing a spectral analysis on the output signal of the DFT means.

2. The adaptive detector according to claim 1, wherein the spectral analysis means comprises:

means, whose input is connected to the output of the DFT means, for taking the magnitude squared of each of the transform values; and a means, whose input is connected to the output of the magnitude square means, for integrating the magnitude squared values.

3. The adaptive detector according to claim 1, further comprising:

means, whose input is connected to the output of the spectrum analyzer, and having two outputs, for detecting at one output those signals which exceed a certain threshold, and those signals which do not exceed a predetermined threshold at the other output.

4. The adaptive detector according to claim 2, further comprising means, whose input is connected to the output of the integrator, and having two outputs, for detecting at one output those signals which exceed a certain threshold, and those signals which do not exceed a predetermined threshold at the other output.

* * * * *